(12) United States Patent
Evans et al.

(10) Patent No.: US 6,172,512 B1
(45) Date of Patent: Jan. 9, 2001

(54) IMAGE PROCESSING METHODS FOR THE OPTICAL DETECTION OF DYNAMIC ERRORS IN INTEGRATED CIRCUITS

(75) Inventors: Richard James Evans, Underhill, VT (US); David Frank Heidel, Mahopac, NY (US); Jeffrey Alan Kash, Pleasantville, NY (US); Daniel Ray Knebel, Carmel, NY (US); James Chen-Hsiang Tsang, White Plains, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/026,287

(22) Filed: Feb. 19, 1998

(51) Int. Cl.⁷ .................................................. G01R 31/302
(52) U.S. Cl. ............................................................ 324/752
(58) Field of Search ..................... 324/750–752, 324/753; 382/145, 149; 348/125, 126

(56) References Cited

U.S. PATENT DOCUMENTS

| | | | |
|---|---|---|---|
| 4,755,874 | * | 7/1988 | Esrig et al. ............................ 348/126 |
| 5,032,727 | * | 7/1991 | Cox, Jr. et al. ....................... 250/330 |
| 5,592,100 | * | 1/1997 | Shida et al. ........................... 324/751 |
| 5,598,100 | * | 1/1997 | Maeda et al. ......................... 324/501 |

* cited by examiner

*Primary Examiner*—Josie Ballato
*Assistant Examiner*—Russell M. Kobert
(74) *Attorney, Agent, or Firm*—Scully, Scott, Murphy & Presser; Wayne L. Ellenbogen, Esq.

(57) ABSTRACT

Methods for the ready identification of dynamic defects using switching induced light emission from CMOS gates in complex integrated circuits such as microprocessors are described. The rapid increase in the complexity of logic circuits means that practical gate level identification of the sources of dynamic errors will require methods other than the gate by gate tracing of every possible path taken by a given set of instructions. The methods described here are based on the ability of picosecond imaging circuit analysis to detect the switching activity of every gate of a complex circuit in a single, passive measurement, and the ability of data processing today to compare large two- and three-dimensional files.

11 Claims, 2 Drawing Sheets

IMAGE PROCESSING METHODS FOR THE OPTICAL DETECTION OF DYNAMIC ERRORS IN INTEGRATED CIRCUITS

FIELD OF THE INVENTION

The invention relates to the testing of VLSI circuits, and in particular to a system and method for determining the source of circuit failures that are associated with changes in operating conditions.

BACKGROUND OF THE INVENTION

Until recently, most fails in CMOS integrated circuits involved behavior that appeared as soon as power was applied. Faulty gates that were supposed to draw no current, for example, drew significant currents. Failure analysis consisted of the physical identification of these gates. Today, there are many more subtle failures. For example, circuits often show good static and low frequency behavior, but produce errors when operated at high frequencies. Other problems stem from proper functionality at some temperatures, and not others, etc. The fails can be as subtle as errors in calculations which occur only when the operating frequency of the chip is above some level. In fact, the performance of modern integrated circuits is verified by operating them at a particular speed, and checking to see if the correct output is produced after a particular set of operations. The process is iterated until a speed is reached where errors appear. The chip is then sold as one that works properly at the highest speed where no errors were detected.

The process of identifying the specific devices or circuits which limit the high speed performance of a chip is commercially critical since the value of the part increases rapidly with increasing computational power. The computational power of a chip is determined by its design and by the frequency at which it operates. However, identification of the devices within a circuit that limit the high frequency performance is difficult today. This is because logic circuits can now involve more than 10 million gates, and the instructions that produce a detectable error in the operation of the microprocessor can involve tens of thousands of cycles of the microprocessor. The detected error can be due to a problem in a single gate during one cycle. Thus, if there are 10 million gates, and the test involves 10 thousand processor cycles, there are potentially 100 billion switching events that must be checked. Existing techniques that involve the serial measurement of the voltage waveforms for every node would be extremely time consuming under such conditions and therefore lack practicality for testing modern integrated circuits.

In the past, dynamic fault imaging has been used in the effort to detect the source of errors in VLSI circuits. Dynamic fault imaging involves IC testers running extensive test patterns and at each test vector, the generation and storage of an e-beam image showing all logic states on a chip. In the past, dynamic fault imaging required hundreds of test vectors to perform such a test; currently, tens of thousands or more are needed due to increased design complexity. This process was done for a good chip and for a failing chip and then digital subtraction of the two data sets was performed to obtain an image of the fault. This method is not widely practiced on modern integrated circuits due to device complexity, multiple metal levels, complex bussing and flip chip packaging, all of which limit the ability of an e-beam based tester to obtain an image in a reasonable amount of time, or at all.

Commonly owned and copending U.S. Pat. No. 5,940,545, entitled NONINVASIVE OPTICAL METHOD FOR MEASURING INTERNAL SWITCHING AND OTHER DYNAMIC PARAMETERS OF CMOS CIRCUITS, incorporated herein by reference, describes a technique referred to herein as picosecond imaging circuit analysis (PICA) which is used to acquire data representing the switching of CMOS gates in an integrated circuit. Every switching event produces a pulse of light which can be captured by an optical detector. In contrast to the previously described e-beam techniques where data must be obtained individually from each net of the circuit, the PICA technique provides a means for obtaining, in a single measurement, the switching waveforms of all of the gates in an integrated circuit. The ability to obtain in a single measurement full switching information from a complex integrated circuit means that the solution for identifying a defect is no longer limited by the length of time required to acquire the relevant data, but rather is limited by the ability to identify a single event in a field of hundreds of billions of switching transitions.

SUMMARY OF THE INVENTION

This invention provides simple means for using picosecond imaging circuit analysis data and digital image processing to identify the source of these faults.

In accordance with the invention, a system and method are provided for detecting the source of faulty operation given an integrated circuit that operates properly under a first set of operating conditions and improperly under a second set of operating conditions, comprising: in a first test operation, applying a first input to the integrated circuit under a first set of conditions which result in proper circuit operation; obtaining a first image of light emissions from the circuit while the circuit is processing the first input, the light emissions originating from switching operations of devices in the circuit; storing the image as x,y,t data, where x and y indicate a location in the circuit, and t indicates a time increment during the processing of the test input; in a second test operation, applying a second input to the integrated circuit, the second input being functionally identical to the first input, but under a second set of external conditions which result in improper circuit operation; obtaining a second image of light emissions from the circuit while the circuit is processing the second input under the second set of conditions; and comparing the first and second images to determine the source of the faulty operation of the circuit.

In accordance with a second embodiment of the invention, a system and method are provided for detecting the source of faulty operation of an integrated circuit where proper operation of the circuit under some conditions is not required as a reference, but where a properly operating, functionally equivalent circuit is available to generate a "golden image." This comprises: in a first test operation, applying a first input to a properly operating integrated circuit under a first set of conditions; obtaining a first image of light emissions from the first circuit while the circuit is processing the first input, the light emissions originating from switching operations of devices in the first circuit; storing the image as x,y,t data, where x and y indicate a location in the circuit, and t indicates a time increment during the processing of the test input; in a second test operation, applying a second input identical to the first input to an improperly operating, but otherwise equivalent at the schematic level, integrated circuit, under the same conditions; obtaining a second image of light emissions from the second circuit while the second circuit is processing the second input; appropriately transforming the first and second three dimensional images so that they can be compared, and comparing the first and second images to determine the source of the faulty operation of the second circuit.

DETAILED DESCRIPTION OF A PREFERRED EMBODIMENT OF THE INVENTION

The present invention describes a dynamic fault imaging method using a PICA circuit analyzer infrared emission tool. The PICA analyzer can analyze current and future VLSI technologies and can do so from either the front or the backside of the chip.

In accordance with the invention, the PICA analyzer can be used to analyze chips where electrical tests have shown that correct behavior is obtained under some set of operating parameters, while incorrect behavior, such as numerical errors in calculations, is obtained under other operating conditions. The operating conditions can differ in the clock frequency of the chip, the temperature at which the chip is run, the operating voltage, and other conditions.

Figure 1:
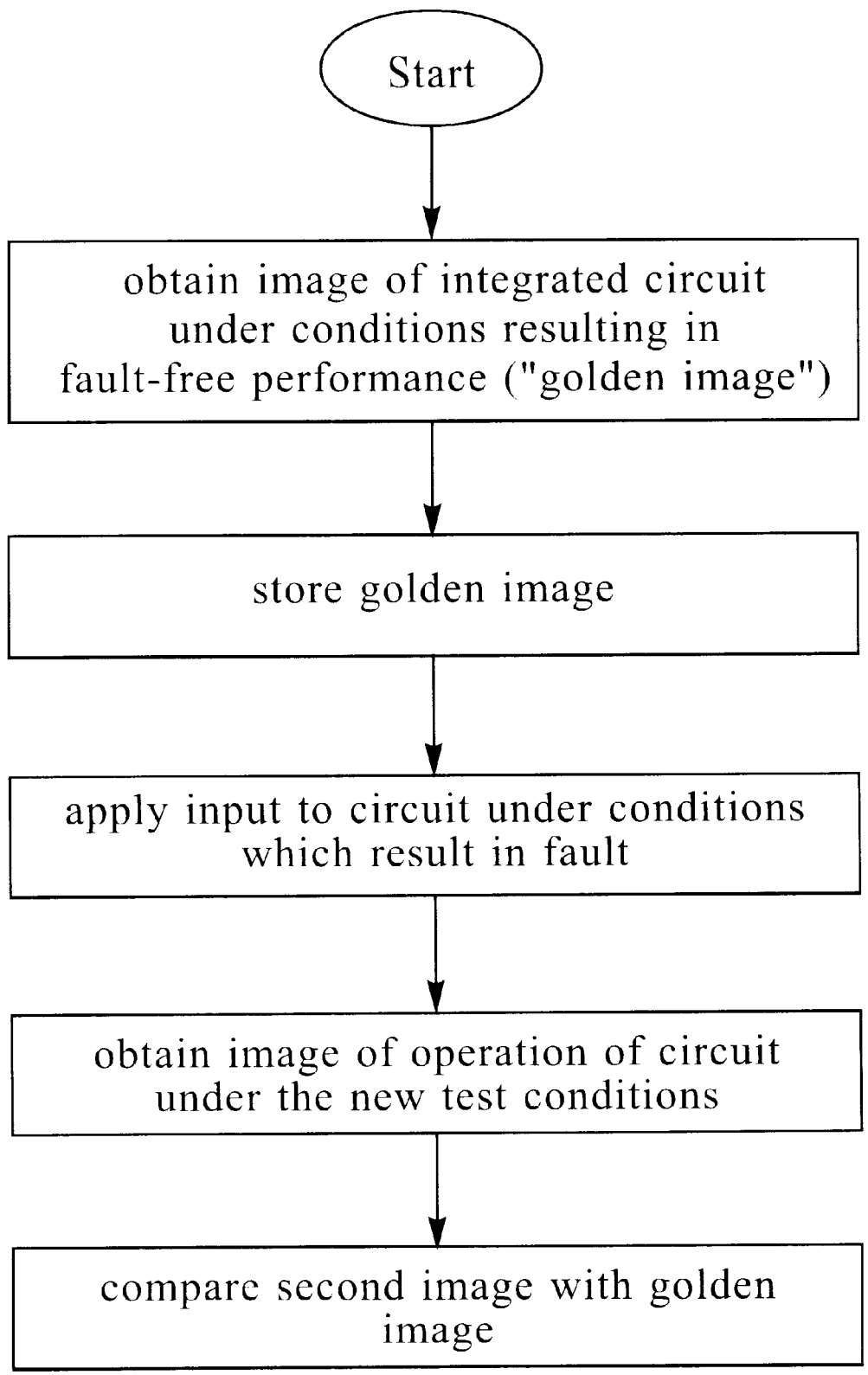
FIG. 1 is a flow diagram of the steps of a first method for detecting a fault in an integrated circuit in accordance with an embodiment of the present invention.

Referring to the flow diagram of FIG. 1, in accordance with the invention, an image of the chip during operation is obtained. The PICA analyzer can be used to observe either the front or the polished backside of the active chip. The PICA imaging system projects an image of the device layer of the integrated circuit onto the face plate of the PICA detector. Within the efficiency of the detector, the PICA detector captures the photons emitted by the device under test which pass through the imaging system in FIG. 1.

In accordance with the invention, the reference, or "golden", image is first obtained by generating an image of the operation of the chip under conditions that result in satisfactory operation of the chip. Because the efficiency of current PICA imaging systems may be as low as 0.000001 (i.e., 1 photon detected for every 1000000 emissions from a given location), the reference image is generated by iteratively applying a test input signal to a chip and observing the photon-generating activity of the chip at all locations x,y on the chip, and at all times t with respect to some reference time generated by the test input signal, during each test iteration. The reference image is stored as a set of points in a three dimensional space composed of the x and y positions in the detector plane and the time of arrival t of the detected photon with respect to a clock signal generated by the device under test. When the data for each iteration is aggregated, the reference image contains information about every switching transition, in the chip during the execution of the test sequence.

The test conditions that were applied to obtain the golden image of the device under test are then replaced by test conditions which produce the electrical failure and applied to the chip. For example, the identical input signals might be applied, but at a higher frequency, or under higher temperature conditions. A PICA image of the second test is obtained in the same manner as the reference image was obtained. To locate the source of the error, a direct comparison of the two images is now performed, with appropriate scaling. Examples of such image scaling include, but are not limited to, differences in clock times, as for example, would occur if the error being investigated arose from operation at a frequency different from that at which the golden image was obtained, or for differences in image size due to differences in the sample preparation and optical fixturing.

The comparison can be done either statically or dynamically. A static comparison is performed by first obtaining the reference and test images, appropriately registering them in time and space and subtracting them. Registration time is performed by scaling the time intervals t in accordance with the difference in frequency of the input signal in the two test sequences while accounting for any frequency independent circuit delays. Registration in space can be performed manually, with reference to landmarks located in the two images, or automatically, for instance by using pattern matching techniques. The images are subtracted simply by comparing corresponding x,y,t entries of the two test images and noting any differences The earliest occurrence t of a difference between the two patterns is identified as first occurrence of the fault responsible for the electrical error.

A dynamic comparison can be performed by running the second test sequence and subtracting the results from the golden image data "on the fly" during accumulation of the data from the second test until a data set in which part of the original golden image is completely subtracted to zero is obtained. If all the emission is plotted in x,y, and t, as the data is collected, and if it is subtracted as it is accumulated, then parts of the original image will continuously decrease in intensity, others will remain constant in intensity, and signals will grow in parts of the x,y,t space where previously there were no signals. The contiguous parts which continuously decrease in intensity are the regions of the circuit where the test sequence is implemented identically in both tests, while the regions which stay constant, or grow in intensity show where deviations from the golden image are occurring. Correct normalization of the test and gold image data will occur when the intensity of the regions which are decreasing, as the test data are accumulated, goes to zero.

In addition, other numerical operations can be used to identify the defect. For example, the three dimensional product of the two images can be computed by multiplying the intensities of the golden and test images at each point in x, y, and t space. The result of this operation is to produce another x,y,t image which has non-zero values where the two files are in agreement, and "0's" where signals occur in one data set but not the other. Such a procedure then gives a signal when the golden and test images are in agreement, and no signal when they are in disagreement, the opposite of the situation when the two images are simply subtracted where identical behavior produces a zero difference signal and any non-zero signal corresponds to behavior occurring in either one or the other image.

Figure 2:
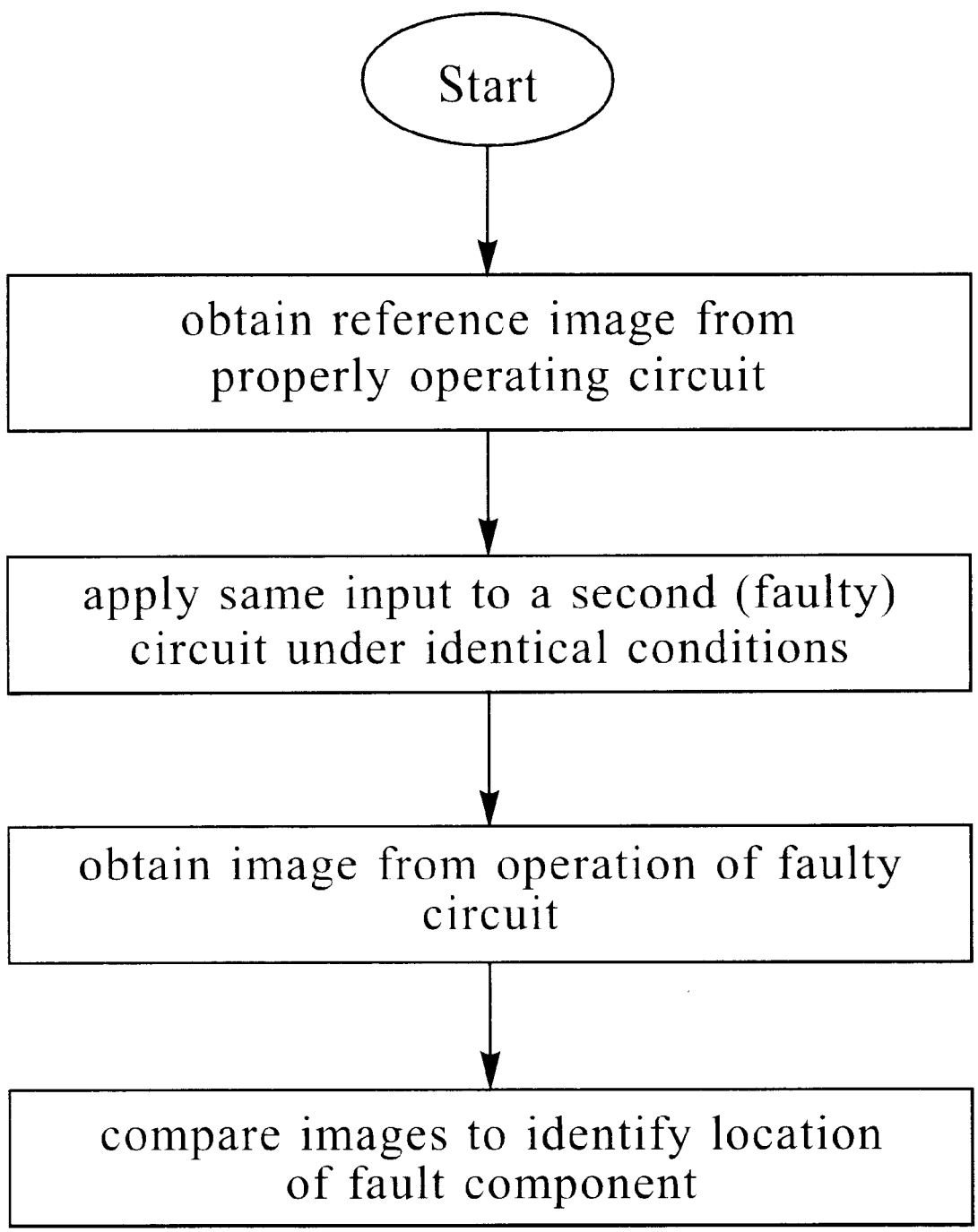
FIG. 2 is a flow diagram of the steps of a second method for detecting a fault in an integrated circuit in accordance with an embodiment of the present invention.

In a further embodiment of the invention, a golden image of a properly-operating circuit can be used to identify the source of a fault in a second, identically-designed integrated circuit which fails under operating conditions identical to the conditions under which the first circuit was found to operate properly. In accordance with this embodiment of the invention, optical image data is gathered which describes the operation of the first chip in response to the given input signal and under the given operating conditions. This image data is stored as the golden image. Next, the same input is applied to the second (faulty) chip, under the same operating conditions, and an optical image describing the operation of the circuit is generated. The optical images, or transformation of the optical images of the circuits into other representations such as a schematic representation, for the first and second test sequences are then compared in one of the various ways described above in order to determine the location of the faulty component in the second circuit. A flow diagram describing this embodiment of the invention is shown in FIG. 2.

In still another embodiment, the invention can be used in the analysis and detection of intermittent failures. In the event that a failure is of the intermittent type, that is, wherein the integrated circuit sometimes fails, the pass/fail condition can be stored as an additional bit of information for each detected photon. Thus, for a given circuit, the data x,y,t, and f can be stored, where f is the additional bit that represents pass/fail status. For example, f=1 could represent passing, while f=0 would represent failing. Then, two images or optical waveforms can be generated as a result of the test vector applied to the circuit. The first image consists of all photons which resulted from a "passing" (i.e., (f=1) circuit operation, while the second consists of all photons which come from a "failing" (i.e., f=0) operation. A comparison of the two images or waveforms is then performed in the same manner described above with respect to comparison of the image of a first chip and a second chip. Note that the analysis of intermittent failures can be applied to any failure analysis technique based on sampling (including electron beam testing), where a pass/fail bit is kept for each sample, with waveforms then being reconstructed for passing or failing conditions.

In a further embodiment of the invention, the value f can take multiple values to represent more than two possible outcomes of the test. For instance, f can also indicate the type of failure.

The above-described methods can be implemented using the PICA system described in U.S. Pat. No. 5,940,545, operating in conjunction with a suitably-programmed general purpose computer.

While the invention has been described in particular with respect to preferred embodiments thereof, it will be understood that modifications to the disclosed embodiments can be effected without departing from the spirit and scope of the invention.

We claim:

1. A method for detecting the source of faulty operation of an integrated circuit that operates properly under a first set of operating conditions and improperly under a second set of operating conditions, comprising:

in a first test operation, applying a first input to the integrated circuit under a first set of conditions which result in proper circuit operation;

obtaining a first image of light emissions from the circuit while the circuit is processing the first input, the light emissions originating from switching operations of devices in the circuit;

storing the image as x,y,t data, where x and y indicate a location in the circuit, and t indicates a time increment during the processing of the test input;

in a second test operation, applying a second input to the integrated circuit, the second input being identical to the first input, but under a second set of conditions which result in improper circuit operation;

obtaining a second image of light emissions from the circuit while the circuit is processing the second input under the second set of conditions;

comparing the first and second images to determine the source of the faulty operation of the circuit.

2. The method of claim 1, wherein the step of comparing comprises subtracting the second image from the first image.

3. The method of claim 2, wherein the source of the faulty operation is defined as the device in the circuit that produced the earliest difference between the first and second images.

4. The method of claim 1, wherein the step of comparing comprises obtaining the three dimensional product of the first and second images.

5. The method of claim 1, wherein the step of comparing comprises registering the two images in time and space.

6. The method of claim 1, wherein the comparison is performed "on-the-fly" while the second image is being obtained.

7. The method of claim 1, wherein the step of comparing is performed statically, after the second image has been completely obtained.

8. The method of claim 1, wherein the difference in operating conditions is the frequency at which the input signal is applied.

9. The method of claim 1, wherein the difference in conditions is the temperature at which the circuit is operated.

10. The method of claim 1, wherein the step of comparing is performed by displaying an image of the collected data and visually comparing the data resulting from the first set of test conditions and the data resulting from the second set of test conditions.

11. The method of claim 1, further comprising correlating the x,y data representing the fault with data describing the physical layout of the circuit to identify the device in the circuit causing the fault.

* * * * *